US006426921B1

(12) United States Patent
Mitamura

(10) Patent No.: US 6,426,921 B1
(45) Date of Patent: Jul. 30, 2002

(54) PORTABLE WRIST DEVICE

(75) Inventor: Gen Mitamura, Chiba (JP)

(73) Assignee: Seiko Instruments Inc. (JP)

(*) Notice: Subject to any disclaimer, the term of this patent is extended or adjusted under 35 U.S.C. 154(b) by 0 days.

(21) Appl. No.: 09/439,827

(22) Filed: Nov. 12, 1999

(30) Foreign Application Priority Data

Nov. 13, 1998 (JP) .......................................... 10-323823

(51) Int. Cl.[7] .......................... G04C 10/10; H01L 35/00

(52) U.S. Cl. ....................... 368/204; 268/203; 268/276; 136/205

(58) Field of Search ........................... 368/64, 88, 203, 368/204, 276, 281, 289; 136/205, 230, 292

(56) References Cited

U.S. PATENT DOCUMENTS

| | | | | |
|---|---|---|---|---|
| 4,106,279 A | | 8/1978 | Martin et al. | 58/23 |
| 4,213,292 A | | 7/1980 | Dolezal et al. | 368/204 |
| 5,517,468 A | | 5/1996 | Inoue et al. | 368/64 |
| 5,705,770 A | * | 1/1998 | Ogasawara et al. | 136/205 |
| 5,889,735 A | * | 3/1999 | Kawata et al. | 368/64 |
| 5,974,002 A | * | 10/1999 | Tsubata | 368/204 |
| 6,075,575 A | * | 6/2000 | Kawata | 368/204 |
| 6,075,757 A | * | 6/2000 | Kawata | 368/204 |
| 6,222,114 B1 | * | 4/2001 | Mitamura | 368/203 |
| 6,304,521 B1 | * | 10/2001 | Kanesaka | 368/204 |

FOREIGN PATENT DOCUMENTS

| | | |
|---|---|---|
| JP | 7-32590 | 6/1995 |
| JP | 10111368 | 4/1998 |

OTHER PUBLICATIONS

Patent Abstracts of Japan, vol. 1996, No. 66 Jun. 28, 1996.

* cited by examiner

*Primary Examiner*—Vit Miska
*Assistant Examiner*—Jeanne-Marguerite Goodwin
(74) *Attorney, Agent, or Firm*—Adams & Wilks

(57) ABSTRACT

A portable wrist device has a thermoelectric generator for generating electric energy from a temperature difference between a heat receiving portion and a heat radiating portion. A heat radiating upper frame radiates heat from the heat radiating portion of the thermoelectric generator. A back cover supplies heat to the heat receiving portion of the thermoelectric generator. The back cover has an inner surface connected to the heat receiving portion of the thermoelectric generator and an outer surface for contacting a wrist of a user. A heat collecting plate is disposed on the inner surface of the back cover and has a contact portion disposed in contact with the heat receiving portion of the thermoelectric generator. The contact portion of the heat collecting plate has a thickness greater than other portions of the heat collecting plate for storing higher temperature heat.

18 Claims, 13 Drawing Sheets

PORTABLE WRIST DEVICE

BACKGROUND OF THE INVENTION

1. Field of the Invention

The present invention relates to a portable wrist device having a thermoelectric generator, such as a wristwatch or a pager.

2. Description of the Prior Art

For wristwatches, an example of a portable wrist device, electronic wristwatches have now come into the mainstream, using silver oxide batteries, lithium batteries, etc. as a power source.

However, these batteries are expendable commodities and hence need to be replaced regularly, and thus present the problem of the consumption of the limited resources available on earth.

As a substitute, then, research is being carried out on wristwatches incorporating an internal power generation mechanism.

Known power generation methods include, for example, solar cells that convert light energy, mechanical power generation using gravitational energy, and thermal power generation using the Seebeck effect, based on a temperature difference. Of these mechanisms, the solar cell and mechanical power generation have already been put into practical use. On the other hand, thermal power generation has been disclosed in Japanese Patent Application Laid-open No. Sho 55-20483 (refer to FIG. 1), for example. A frame 104 is made from a heat insulating material, and a metallic back cover 5 is fitted on the bottom side while a metallic bezel 103 is furnished on the top side: to hold a crystal 2. A thermoelectric generator 6 is placed on the inside face of the back cover 5, through a heat conducting plate 107 which has spring-like characteristics. The thermal circuit from the other end of the thermoelectric generator 6 is connected to the bezel 103 through a spring 115, an intermediate ring 108, and a dial 12. This way has theoretically been known for a long time.

When a thermal power generation method is employed in a portable wrist device, the temperature difference between the body temperature (high temperature section) transmitted to the portable wrist device through the wrist, and the ambient temperature around the portable wrist device (low temperature section) is used.

To obtain a sufficient temperature difference to generate the required electric energy from a thermoelectric generator, thermal conductivity from the high temperature section to a heat receiving portion on the thermoelectric generator, and from a heat radiating portion on the thermoelectric generator to the low temperature section are important. There has been a problem of how to supply heat from the heat supply source, i.e., the back cover to the radiating portion on the thermoelectric generator, with other sections insulated from the heat.

Especially for a portable wrist device, the case itself is small, so the frame gets warm through heat transfer from the back coverin a normal mode, and there is at most only a 2° C. temperature difference between the back cover and the frame. Consequently, it is standard to use an insulating material to insulate between the back cover and the frame. Foamed resins such as Styrofoam, vacuums, etc. are very efficient as insulating materials but are not used due to strength and volume limitations. Plastics, with low thermal conduction but high strength, are known to be in practical use.

However, there is a need for the back cover and the frame to be good heat conductors, so there is a problem with combining or joining materials having opposing characteristics inside a small case without harming performance.

SUMMARY OF THE INVENTION

A back cover similar to that of the past example, but having a newly devised structure and materials, is used as a means to supply body heat from the wrist to the heat receiving portion on the thermoelectric generator in order to solve the above problem.

The back cover supplies heat to the heat receiving portion on the thermoelectric generator, but it is also engaged with the insulating lower frame, a thermal insulator. Heat flows through the insulating lower frame even though it is a thermal insulator. In the past it was common sense to choose a material with good thermal conduction to be used as the back cover material. For the present invention, however, a stainless steel or titanium with an intermediate or lower thermal conductivity is used, making it difficult for heat to flow through the insulating lower frame.

Originally it was not desirable to use a material with a low thermal conduction since the required amount of heat to the heat receiving portion on the thermoelectric generator also dropped. For the present invention, a heat collecting plate formed from a high thermal conductivity material such as copper or aluminum is closely attached or fixedly adhered to the inside base surface of the back cover. The back cover base is an approximately 0.5 mm thin plate, and since it is several millimeters in the radial direction, heat flows predominantly through the thickness of the back cover, towards the heat collecting plate.

According to the present invention, heat from the wrist travels easily to the inside face of the back cover because the back cover thickness is thin, but is not transmitted easily in the radial direction. A heat collecting plate is closely attached to the inside face of the base cover so heat flows from the wrist to the heat collecting plate. The heat collecting plate is made from a material with good thermal conductivity, so the movement of heat occurs quickly. If the heat collecting plate is fixedly adhered to the inside face of the base cover using solder, wax, etc., then even better heat conductivity can be produced.

Further, the cross sectional shape of the heat collecting plate in the present invention is made thick in some parts to store higher temperature heat in the thickened parts. In particular, by thickening the parts in contact with the heat receiving portion on the thermoelectric generator, and enlarging the volume, higher temperature heat is concentrated.

According to the invention of this structure, heat from the wrist, taken in over the entire area of the back cover, is concentrated at the heat collecting plate, just as with a funnel. This brings about an effect like pouring heat into the heat receiving portion on the thermoelectric generator.

In addition, the present invention has a structure where an insulating material is either applied or affixed to the inside face of the heat collecting plate, excluding those portions in contact with the heat receiving portion on the thermoelectric generator in order to retain heat and prevent heat from escaping. It is applied to the inside face of the back cover as well, excluding those portions in contact with water proof packing.

By applying the insulating material, the structure of the present invention prevents a drop in the temperature of the heat collecting plate, and due to the large surface area of the back cover and the heat collecting plate, radiational cooling of the concentrated heat is suppressed, and a higher temperature of heat can be supplied to the thermoelectric generator.

In addition, by inserting a heat transfer cushion between members in the present invention, it is possible to ease the manufacturing precision of the parts, and mass production can be facilitated, while at the same time shock resistance can be increased.

BRIEF DESCRIPTION OF THE DRAWINGS

A preferred form of the present invention is illustrated in the accompanying drawings in which.

DETAILED DESCRIPTION OF THE PREFERRED EMBODIMENTS

Embodiments of a portable wrist device according to the present invention are each explained below.

[Embodiment 1]

Figure 2:
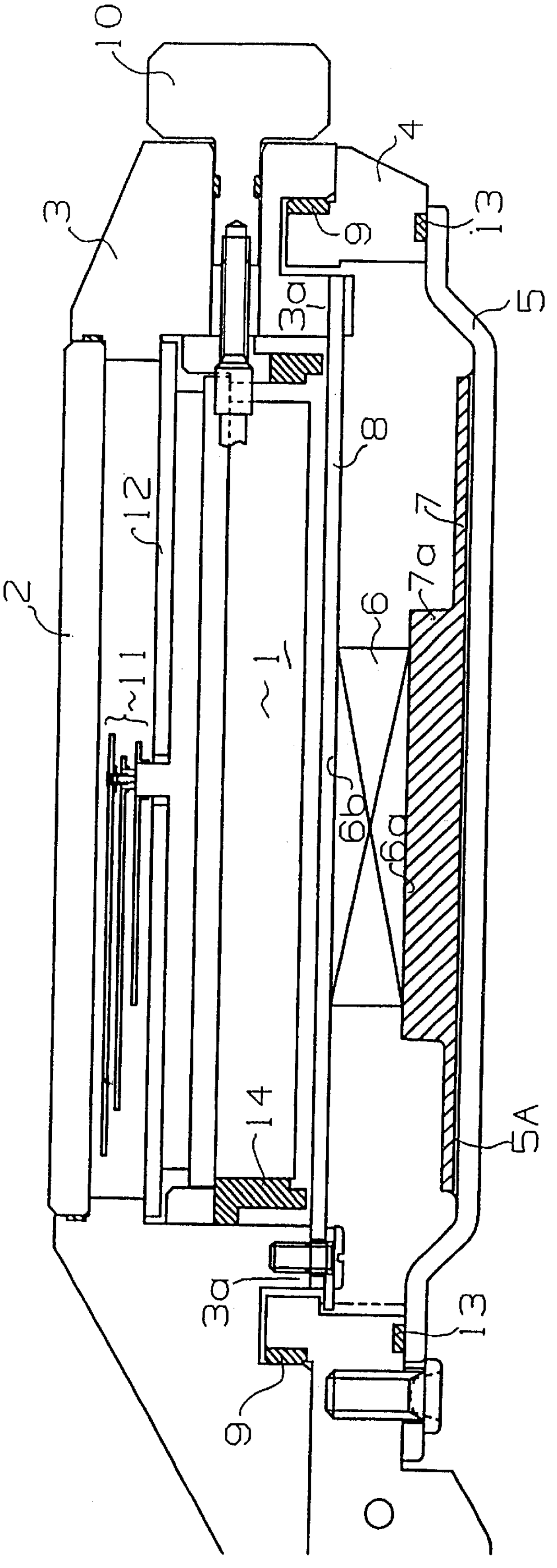
FIG. 2 is a cross sectional view of a wristwatch exemplified as an embodiment 1 of a portable wrist device according to the present invention.

FIG. 2 is a cross sectional view of one quarter of a wristwatch (the cross section from 12 o'clock to the center to 3 o'clock), exemplarily showing a portable wrist device of the embodiment 1 according to the present invention.

The wristwatch of this embodiments is composed of a movement 1; a dial 12; hands 11; the crystal 2 which protects the hands 11 from above; a heat radiating upper frame 3 that supports the crystal 2 and radiates heat to the open air; an insulating lower frame 4 that insulates the heat radiating upper frame 3 and a back cover 5; the back cover 5 that covers the lower face of the insulating lower frame 4; a heat collecting plate 7 that collects heat from the back cover 5; a thermoelectric generator 6 that supplies electric energy to the movement 1; and a heat conducting plate 8 that conveys heat from the thermoelectric generator 6 to the heat radiating upper frame 3, etc. A middle casing 14 supports the movement 1, and a stem 10 operates the movement 1. A gasket 9 fixes the heat radiating upper frame 3 to the insulating lower frame 4 to obtain a water proof structure. A packing 13 provides water proof sealing to the back cover 5 and the insulating lower frame 4. Hereinbelow, the above reference symbols are used uniformly.

The thermoelectric generator 6 is structured from a multiple number of thermal power generating elements, a casing to protect the thermoelectric generating elements, which are sandwiched by a heat radiating portion 6*b* on the top and a heat receiving portion 6*a* on the bottom to convey heat. The thermoelectric generator 6 makes use of the temperature difference between the heat receiving portion 6*a* (high temperature portion) and the heat radiating portion 6*b* (low temperature portion) through the Seebeck effect, generating a prescribed electric energy. The heat receiving portion 6*a* on the thermoelectric generator 6 contacts the heat collecting plate 7 soldered to the back cover 5, and the heat radiating portion 6*b* is disposed so as to be fixed to a thermal conducting portion 3*a* on the heat radiating upper frame 3 through the heat conducting plate 8.

A foamed, hard urethane resin insulating.; material with a thermal conductivity of 0.02W/m/° C. or less, for example, is optimal from standpoint of insulating for the insulating lower frame 4. However, with the restrictions on mechanical strength, water resistance performance, and design factors taken into consideration, an engineering plastic such as polycarbonate, etc., with a thermal conductivity of approximately 0.2W/m/° C. is used. Further, the mixing in of glass fibers makes the thermal conductivity drop, but provides a high mechanical strength so that the insulating lower frame 4 can be made thin, which is effective depending on a design shape. The inside of the insulating lower frame 4 is formed with an accommodation space (hollow portion), running through the frame on the top and bottom, in order to accommodate the thermal conducting portion 3*a* on the heat radiating upper frame 3, the thermoelectric generator 6, etc. The back cover 5 is installed on the opening on the lower face side of the space, so that it covers the opening, and the heat radiating upper frame 3 is fixed to the opening on the upper face side by the plastic gasket 9 to provide water resistance. The heat radiating upper frame 3 is formed with an accommodation space (hollow portion), running through the frame on the top and bottom, in order to accommodate the movement 1, the hands 11, the dial 12, etc. The heat conducting plate 8 is fixed with a screw to the opening on the lower face side of the space, and the crystal 2 is fixed to the opening on the upper face side.

The insulating lower frame 4 is fixed to the back cover 5 with a screw or the like, while the packing 13 (for example, plastic, rubber, etc.) is put into the concave portion formed on the connecting section of the insulating lower frame 4.

Further, a gasket 9 that is elastic as well as insulating (for example, plastic, rubber, etc.) is pushed into the space between the insulating lower frame 4 and the heat radiating upper frame 3. The insulating lower frame 4 is fixed to the heat radiating upper frame 3 by elastic force of the gasket 9, maintaining a water proof state.

The back cover 5 is formed in a disk or angular shape from a metal material with a relatively low thermal conductivity, such as Ti, a Ti alloy, SUS, etc. with a thermal conductivity of 50W/m/° C. or less. The heat collecting plate 7, which has a high thermal conductivity, is fixed to the inside face (the face on the side of the movement 1). It is desirable that solder or wax be used from a thermal conductivity standpoint, but adhesives with good thermal conductivity may be used, or if another means of fixing in place is available, the pieces may simply be placed in close contact. In addition, if a material with a very high thermal conductivity such as copper (Cu) is used for the heat collecting plate 7, it is possible to use a metal such as brass (Bs), etc., with a thermal conductivity on the order of 100W/m/° C., for the back cover 5. Looking g from the point of strength, the thickness of the back cover 5 should be 0.3 mm or greater, and from the point of heat conduction, a value of 1 mm or less is desirable. For practical use, 0.5 (female) to 0.8 mm (male) is recommended.

It is desirable to use aluminum (Al) or copper (Cu), or an alloy of the two, which each have a high thermal conductivity in the range 200 to 400W/m/° C., for the heat collecting plate 7. For the back cover 5, it is difficult for heat to be transferred in the plane direction (from the center toward the periphery), and the heat transfer from the back cover 5 to the insulating lower frame 4 is lessen. In contrast, the plate thickness of the back cover 5 is thin, so heat is easily conveyed from the outer surface of the back cover to the inner surface, and since the thermal conductivity is very high, as above, heat from the wrist is immediately transmitted to the heat collecting plate 7. Actual measurements show that when the heat collecting plate 7 is not used, the temperature difference between the center of and the periphery of the back cover 5 is 0 to 0.1° C. However, in the embodiment where the heat collecting plate is integrated into the stainless steel (SUS) according to the present invention, a temperature difference between the center and the periphery is 0.2 to 0.3° C. In addition, a temperature of almost the same as that of the center of the back cover 5 is obtained in the thicker section of the heat collecting plate 7, and the section shows a temperature higher than in the back cover 5 immediately after the watch is removed from the wrist, and the heat collection effect is confirmed.

A combination of a SUS back cover, with a thermal conductivity of approximately 20W/m/° C., and a pure copper (Cu) heat collecting plate, with a thermal conductivity of approximately 400W/m/° C., gives the best results. However, the back cover can be made from Bs (approximately 100W/m/° C.) provided that the heat collecting plate 7 is made from pure copper (Cu, approximately 400W/m/° C.). Further, with the back cover made from SUS (thermal conductivity approximately 20W/m/° C.) and the heat collecting plate made from brass (Bs, approximately 100W/m/° C.), etc., some effect is seen. If it is structured with a combination where the ratio of the thermal conductivity of the heat collecting plate, to that of the back cover, is at least 4 to 5 times, the effect is confirmed.

In addition, the contact section of the heat receiving portion 6*a* on the thermoelectric generator 6 is formed partially in a thick section 7A on the heat collecting plate 7, so heat easily accumulates and a high temperature is maintained. In this way, the heat collecting plate 7 collects effectively the heat transmitted from the contact surface of the wrist to the back cover 5 by going in the inside surface direction rather than in the radial direction and the thick section 7*a* in contact with the heat receiving portion 6*a* on the thermoelectric generator 6 collects heat of higher temperature.

In this way heat from the wrist is maintained at a higher temperature and is transmitted to the end face of the heat receiving portion 6*a* on the ad thermoelectric generator 6. On the other hand, the heat radiating portion 6*b* on the thermoelectric generator 6 transmits heat through the heat conducting plate 8 to the heat radiating upper frame 3, where the heat is radiated to the air.

The heat collecting plate 7 is thermally in contact with the inside surface of the back cover 5, and it is connected with a bonding member 5A high in thermal conductivity in order to strengthen the thermal contact. There are many bonding methods such as brazing gold, silver, aluminum, etc., soldering, which has superior processing characteristics but which will allow the performance to drop slightly, and others such as pressure welding, welding, etc. This type of connection can reduce heat transfer losses from the back cover 5 to the heat collecting plate 7. If the performance of the thermoelectric generator 6 rises, a heat-conducting adhesive can be used.

Figure 3:
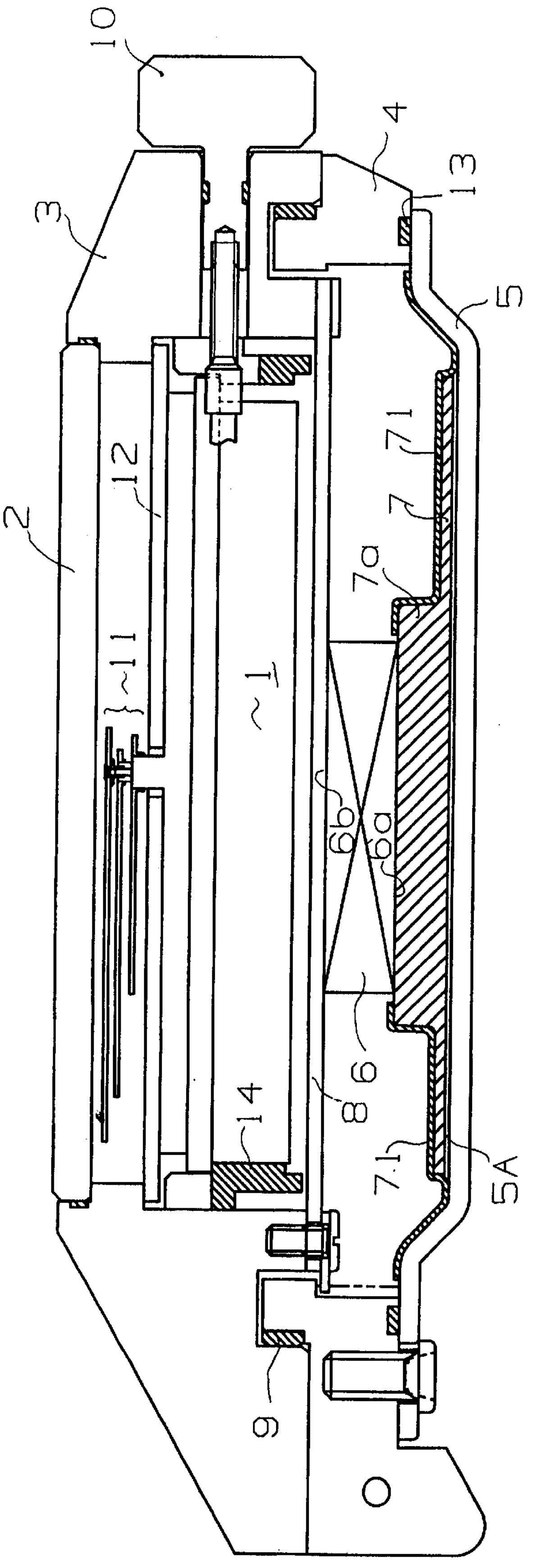
FIG. 3 is a cross sectional view of a modified example of a wristwatch in which an insulating material is applied to a heat collecting plate in the embodiment 1.

In addition, for the present invention an insulating paint 71 is applied to the surface of the heat collecting plate 7, except for the contact area with the back cover 5 and the contact portion to the heat receiving portion 6*a* on the thermoelectric generator 6, as in FIG. 3. By doing this to prevent wasteful heat radiation and maintain a high temperature for the heat collecting plate 7, high temperature heat can be supplied to the heat receiving portion 6*a* on the thermoelectric generator 6. Note that if the application of the insulating paint 71 is extended to the surface of the back cover on the periphery of the heat collecting plate 7, the effectiveness will increase more.

Figure 4:
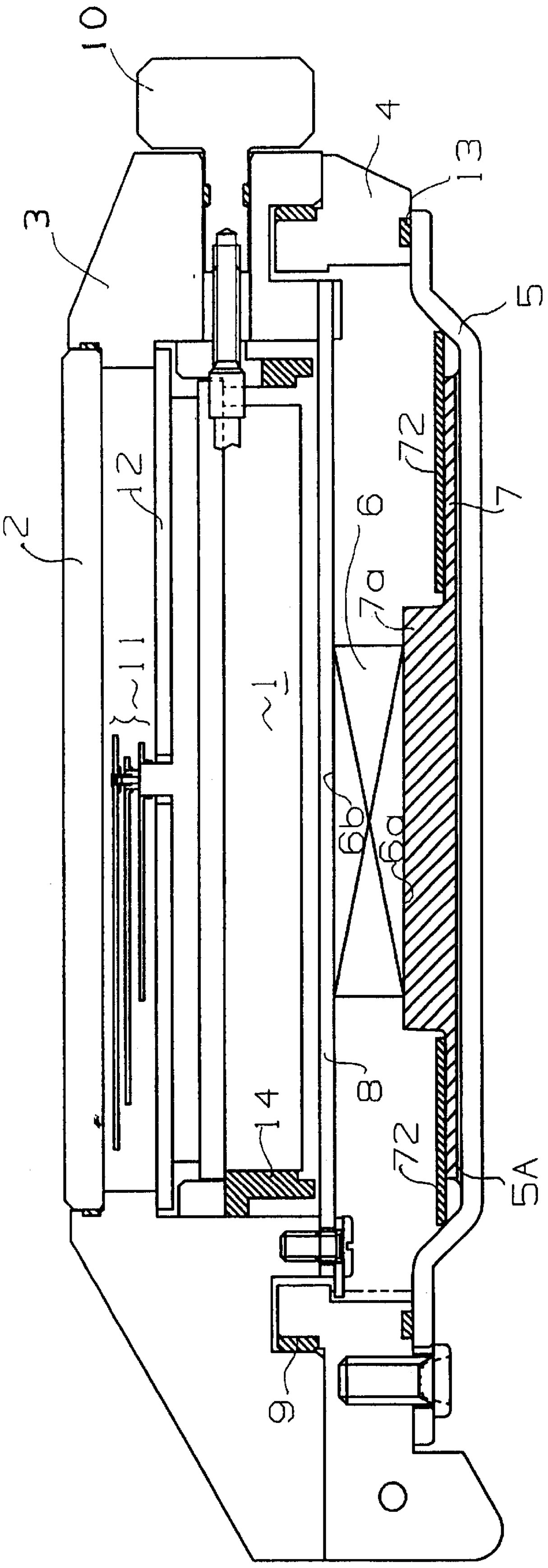
FIG. 4 is a cross sectional view of a modified example of a wristwatch,in which an insulating sheet is affixed to the heat collecting plate in the embodiment 1.

In addition, as in FIG. 4, if an insulating sheet 72 is affixed to the surface of the heat collecting plate 7, except for the contact area with the back cover 5 and the contact portion to the heat receiving portion 6*a* on the thermoelectric generator 6, as a substitute for applying an insulating material, the same effectiveness is obtained.

[Embodiment 2]

Figure 1:
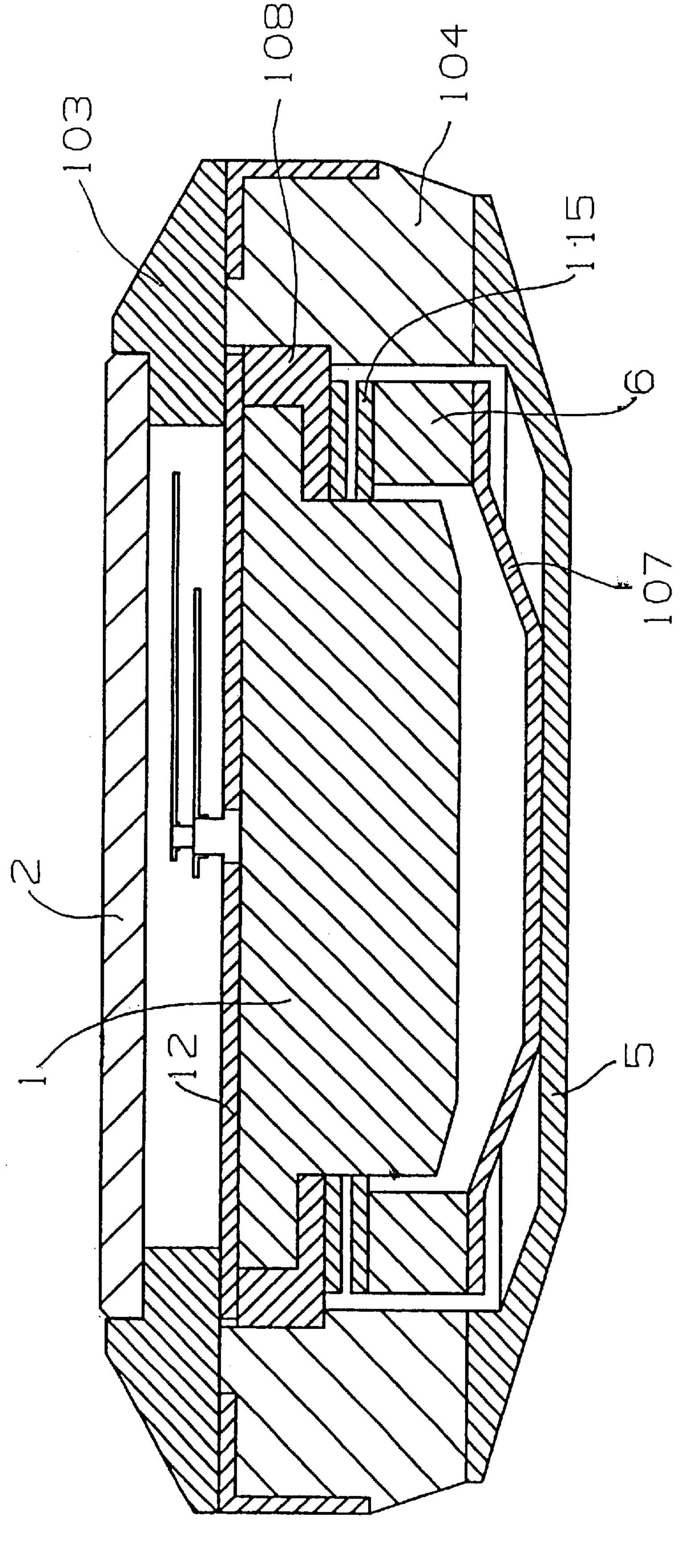
PRIOR ART FIG. 1
FIG. 1 is a cross sectional view of a prior portable wrist device.
Figure 5:
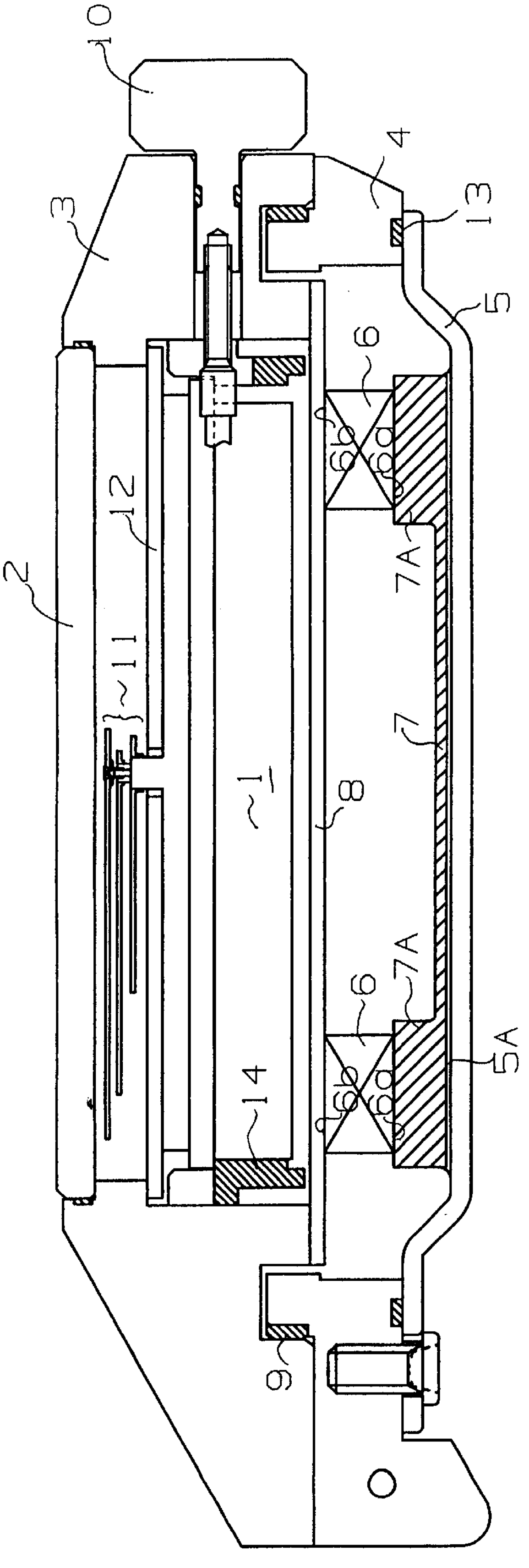
FIG. 5 a cross sectional view of a wristwatch exemplified as an embodiment 2 of a portable wrist device according to the present invention.

An embodiment 2, shown in FIG. 5, is an embodiment in which the ring shaped thermoelectric generator 6 is loaded with the thermoelectric elements arranged annular configuration. This is the same structure as that of FIG. 1 except that the thermoelectric generator 6 and the heat collecting plate 7 have a different plane shape. Further, each part structure and function is the same, so the same numbers as in FIG. 1 are used, and the explanation here is abbreviated.

The heat collecting plate 7 has a thin center section, and the outer perimeter section that contacts the thermoelectric generator 6 is formed in the thick section 7A. It is difficult for heat to be transferred in the plane direction (in the direction from the center to the perimeter) in the back cover 5, but since the plate thickness of the back cover 5 is thin, it is easy for heat to be transferred from the outer surface of the back cover 5 to the inner surface. And since the thermal conductivity is very high, as above, wrist heat is transferred immediately to the thick section 7A formed on the outer perimeter of the heat collecting plate 7.

In addition for the heat collecting plate 7, the contact section on the heat receiving portion 6*a* of the thermal generator 6 is formed partially in the thick section 7A, so it is easy for heat to accumulate and to maintain a high temperature. Thus, heat that is transferred from the contact surface of the wrist to the back cover 5 is also effectively collected in the radial direction, and higher temperature heat is collected in the thick section 7A which contacts the receiving portion 6*a* on the thermoelectric generator 6.

Further, for cases in which the thermoelectric generator 6 is not a single body but is structured with an arrangement of a multiple number of thermoelectric generators, the thick section 7A of the heat collecting plate 7 also does not have a uniform cross section. Therefore, by providing the thick section 7A to only the portions that contact the heat receiving portions for each of the multiple number of thermoelectric generators, it is possible to effectively use the internal capacity of the portable wrist device.

[Embodiment 3]

Figure 6:
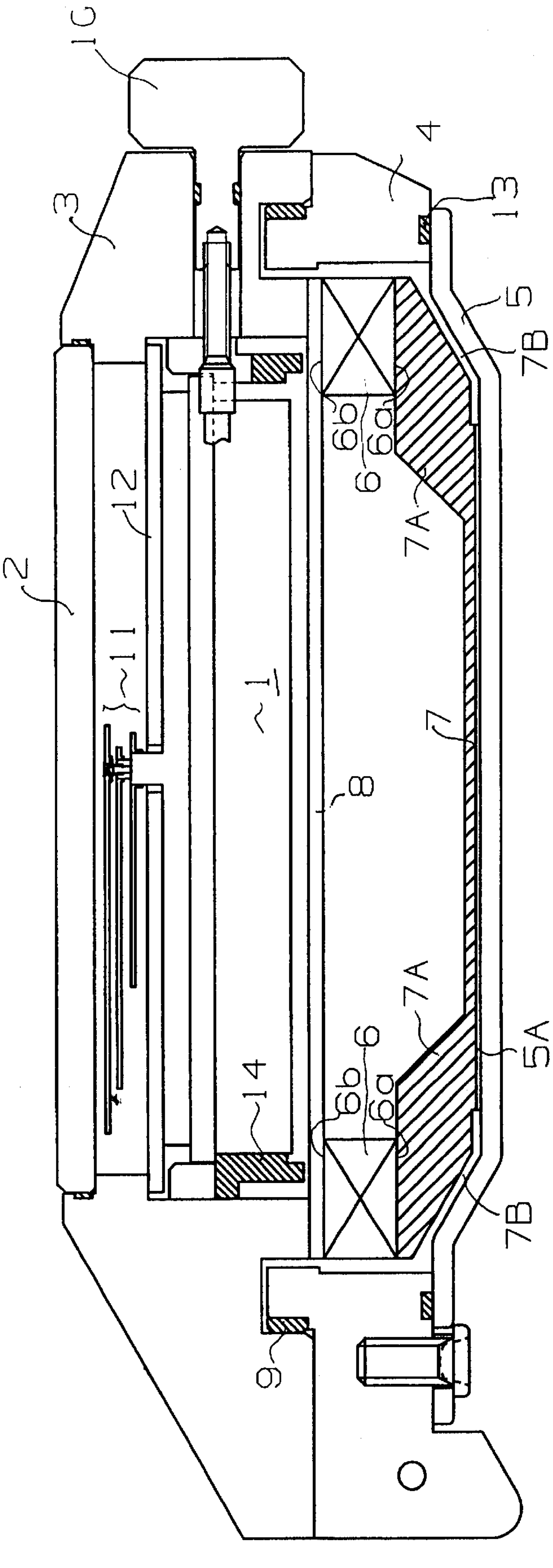
FIG. 6 is a cross sectional view of a wristwatch exemplified as an embodiment 3 of a portable wrist device according to the present invention.

Embodiment 3, shown in FIG. 6, is an example of a case where the plane projection shape of the heat receiving portion 6a on the thermoelectric generator 6 protrudes out from the wrist contact extent of the back cover 5.

Along with setting up the thick section 7A on the outer perimeter of the heat collecting plate 7, a gap 7B is provided close to the outside of the wrist contact region on the back cover 5. This makes for no contact outside of the wrist contact extent on the back cover 5, and also prevents movement of heat from the heat collecting plate 7 to the outer perimeter of the back cover 5.

[Embodiment 4]

Figure 7:
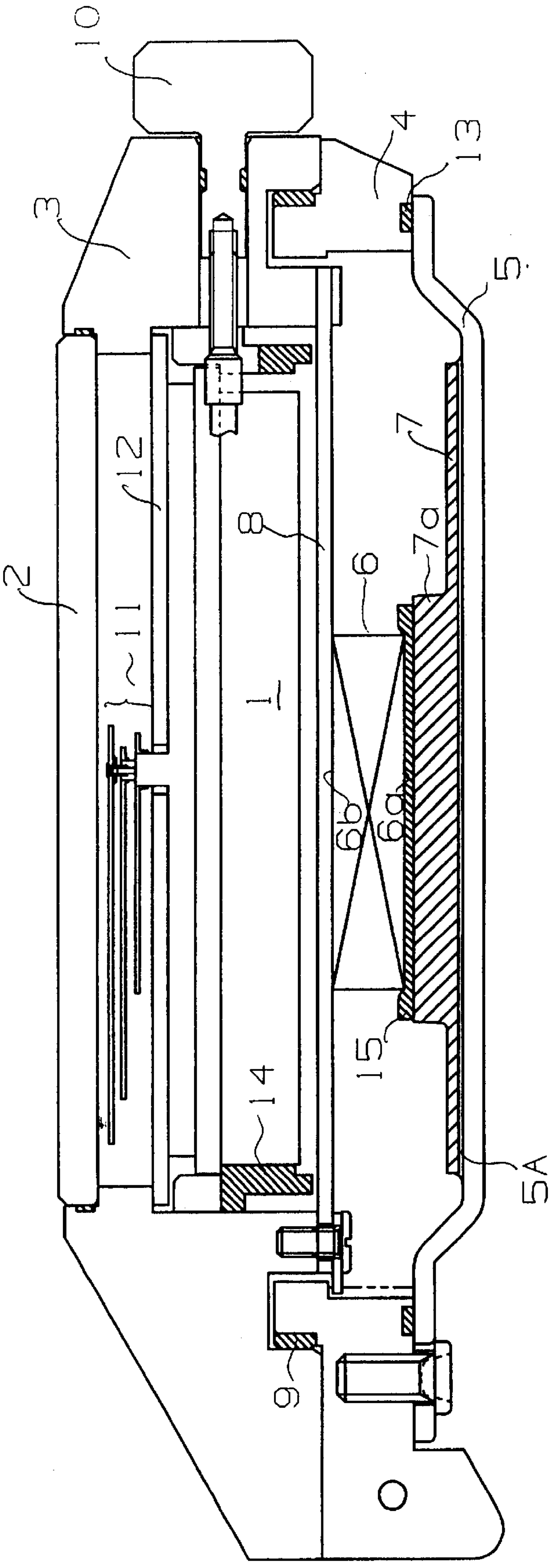
FIG. 7 is a cross sectional view of a wristwatch exemplified as an embodiment 4 of a portable wrist device according to the present invention.

By inserting a heat transfer cushion 15 between the heat receiving portion 6a on the thermoelectric generator 6 and the heat collecting plate 7 as shown in FIG. 7 for the present invention, heat conduction is secured while errors in production are absorbed. The heat transfer cushion 15 used is one of many widely known heat transfer sheets, (high thermal conductivity sheets mainly for letting out heat to the exterior of a semiconductor), with large elasticity and high cushioning properties and formed by mixing a high thermal conductivity metal or ceramic powder into a silicon resin, or formed by a high thermal conductivity metal or ceramic fibers. It is desirable that the thermal conductivity of this heat transfer cushion 15 be 1W/m/° C. or more. The amount of error that can be absorbed is limited to at most 0.2 to 0.3 mm for a structure that absorbs errors in production through a deformation of the heat conducting plate, since it is a metal plate. With the cushion, however, even if there are larger production errors, the contact area does not become smaller and the heat conducting plate itself does not plastically deform, so the power generation capacity is maintained.

Figure 8A:
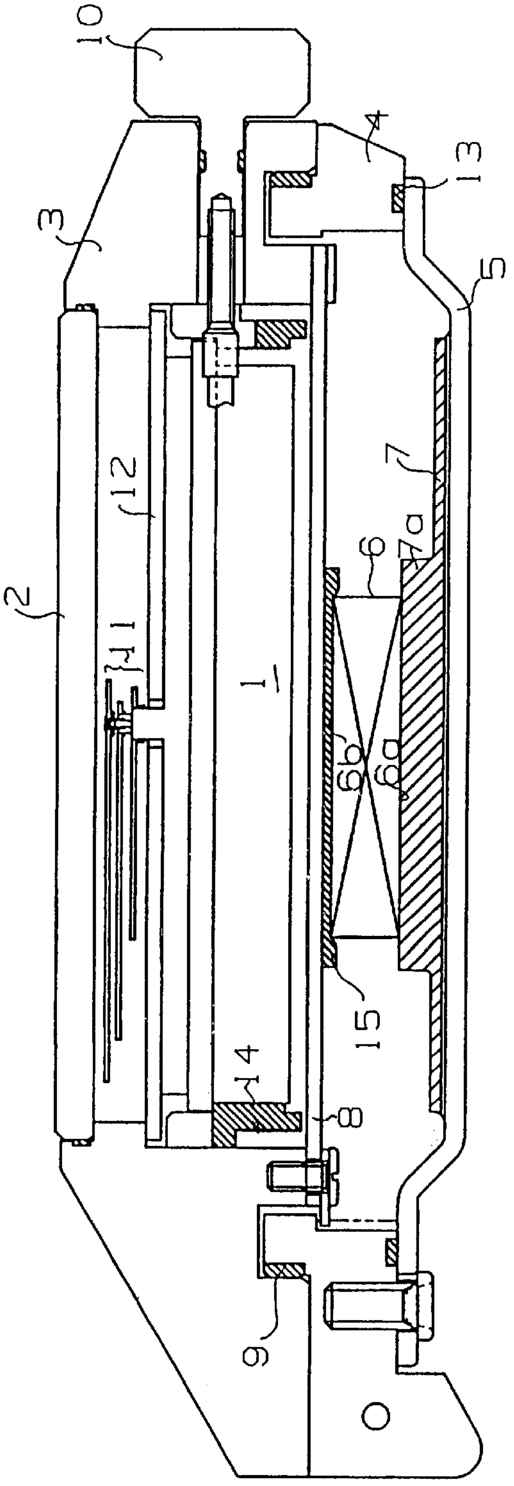
FIGS. 8A–8B are cross sectional views of a wristwatch exemplified as the embodiment 4 of a portable wrist device according to the present invention.
Figure 8B:
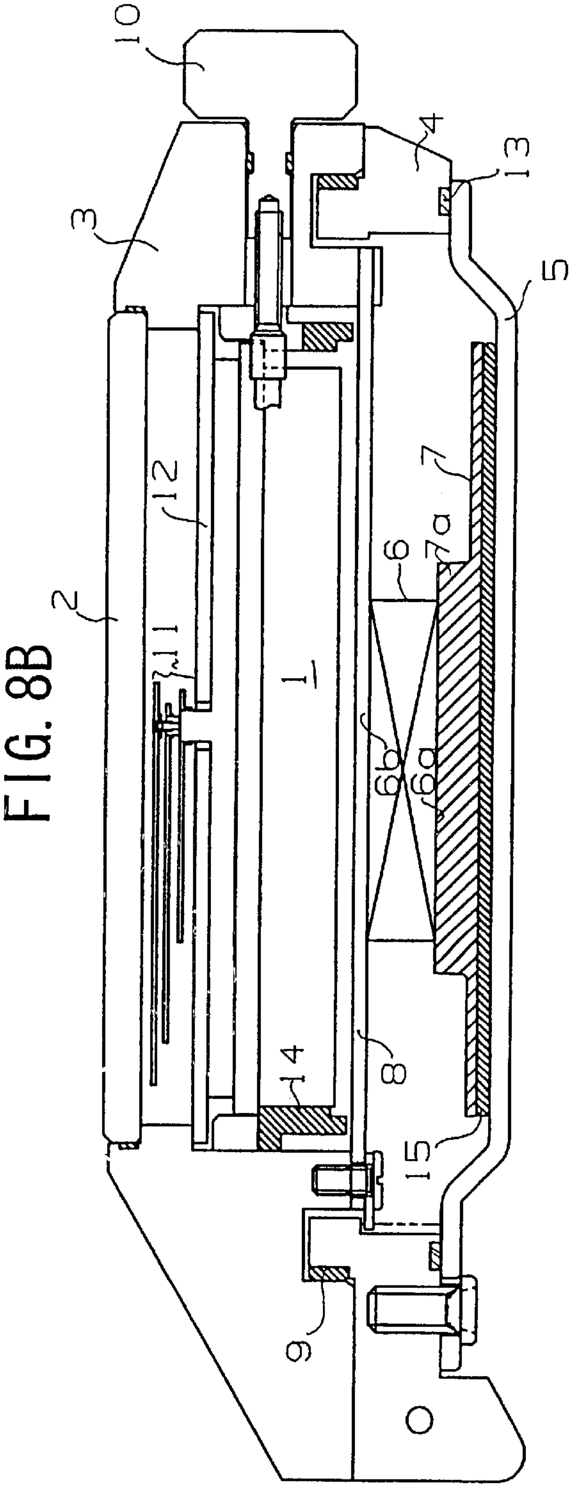

FIG. 8a shows an embodiment with the heat transfer cushion 15 inserted between the heat radiating portion 6b on the thermoelectric generator 6 and the heat conducting plate 8. FIG. 8b shows an embodiment with the heat transfer cushion 15 inserted between the back cover 5 and the heat collecting plate 7.

Figure 9A:
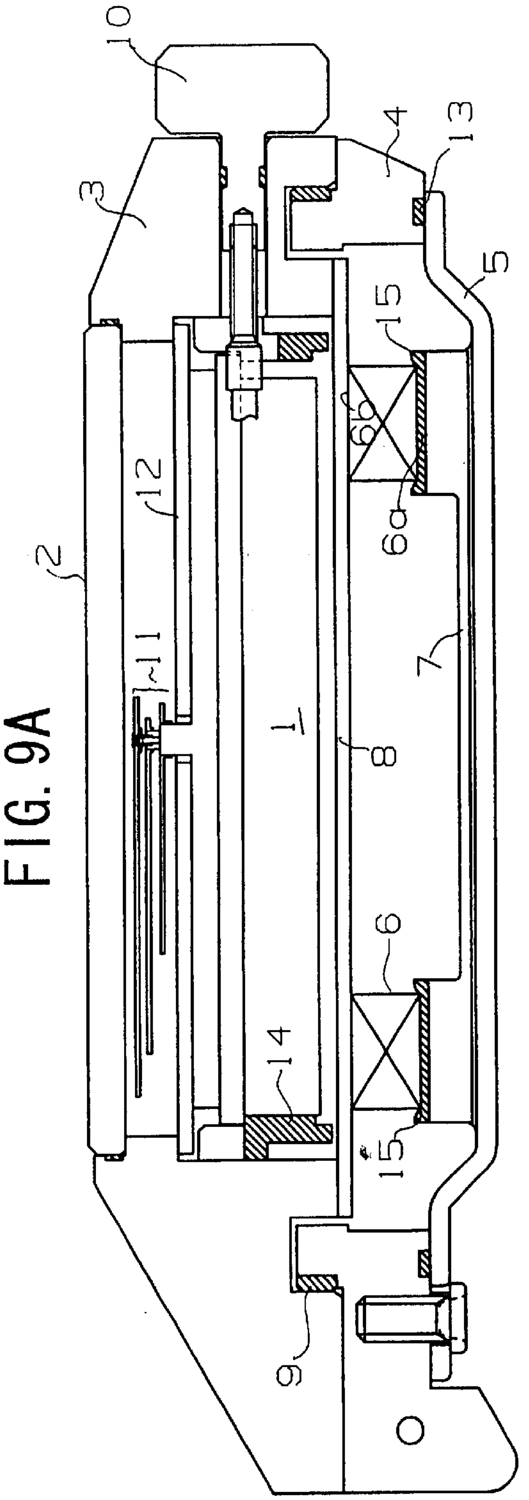
FIGS. 9A–9B are cross sectional views of a wristwatch exemplified as the embodiment 4 of a portable wrist device according to the present invention.
Figure 9B:
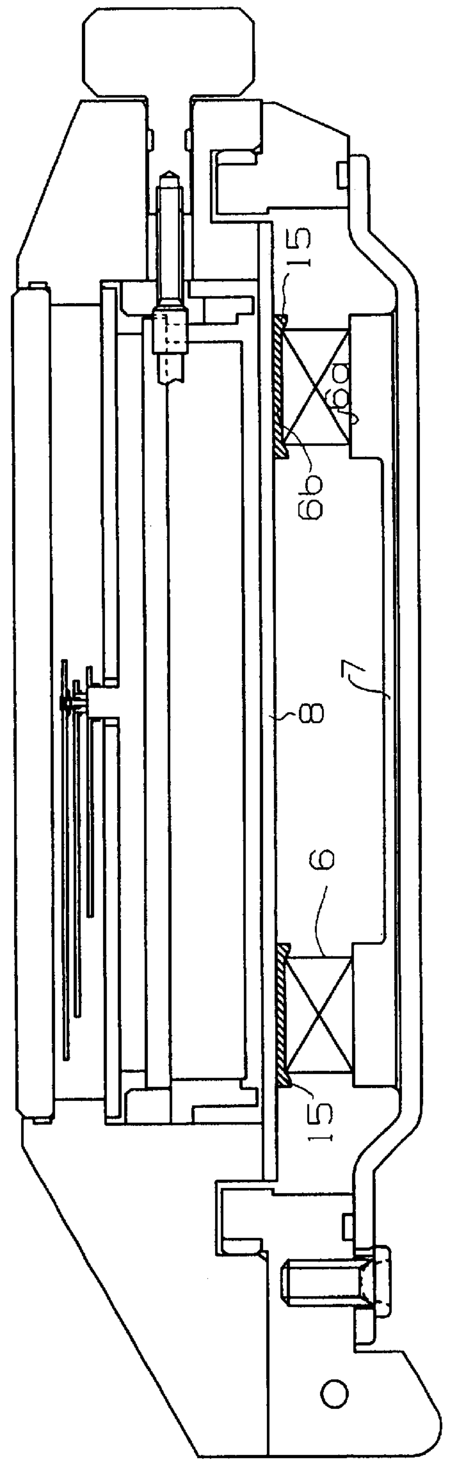

FIGS. 9A and 9B show examples where this is applied to a ring shape thermoelectric generator. FIG. 9A shows an embodiment in which the heat transfer cushion 15, made to resemble the ring shape of the thermoelectric generator 6, is inserted between the heat receiving portion 6a on the thermoelectric generator 6 and the heat collecting plate 7. FIG. 9B shows an embodiment in which the ring shape heat transfer cushion 15 is inserted between the heat radiating portion 6b on the thermoelectric generator 6 and the heat conducting plate 8.

[Embodiment 5]

Figure 10:
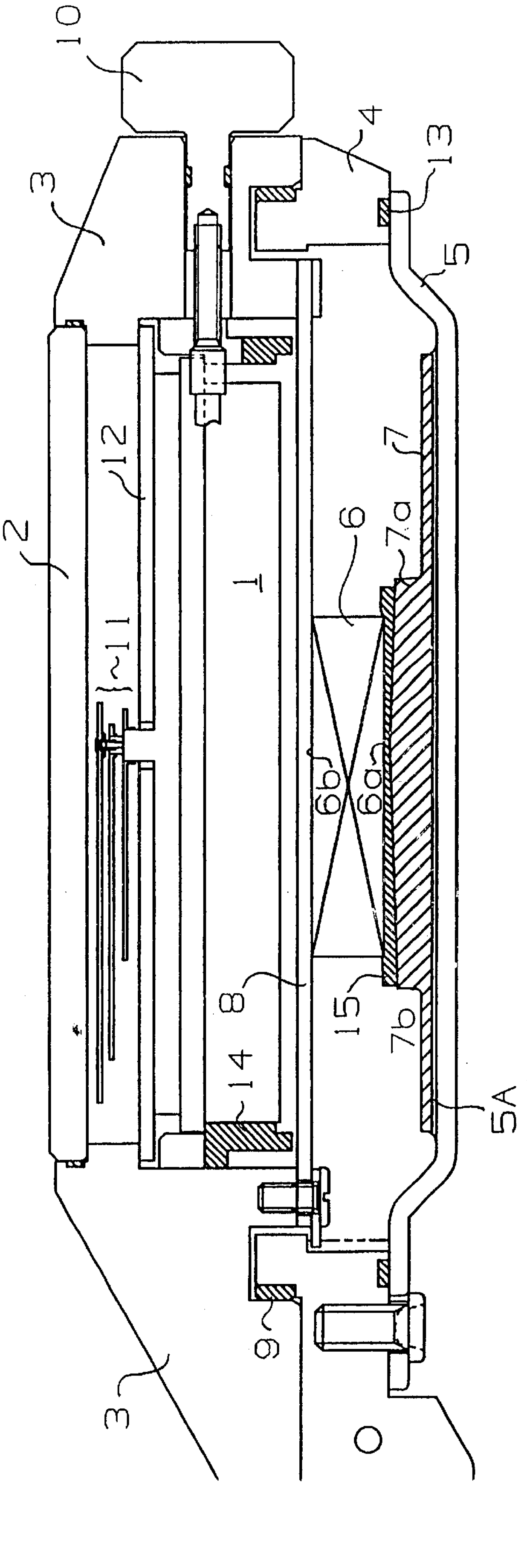
FIG. 10 is a cross sectional view of a wristwatch exemplified as an embodiment 5 of a portable wrist device according to the present invention.

FIG. 10 showing an embodiment is a cross sectional view of a wristwatch, from 12 o'clock to the center to 3 o'clock. The contact surface 7b of the heat collecting plate 7 that corresponds to the heat transfer cushion 15 has been sloped. The center of the slope shows a conic face vertex, but the shape that is easiest to manufacture can be chosen according to designs from a lean-to face, a conic face, a pyramid face, etc. With this, if the sheet becomes thin, the compressive stress when compressed becomes large, so damage to the thermoelectric generator 6 and plastic deformation of the heat conducting plate can be prevented.

Figure 11A:
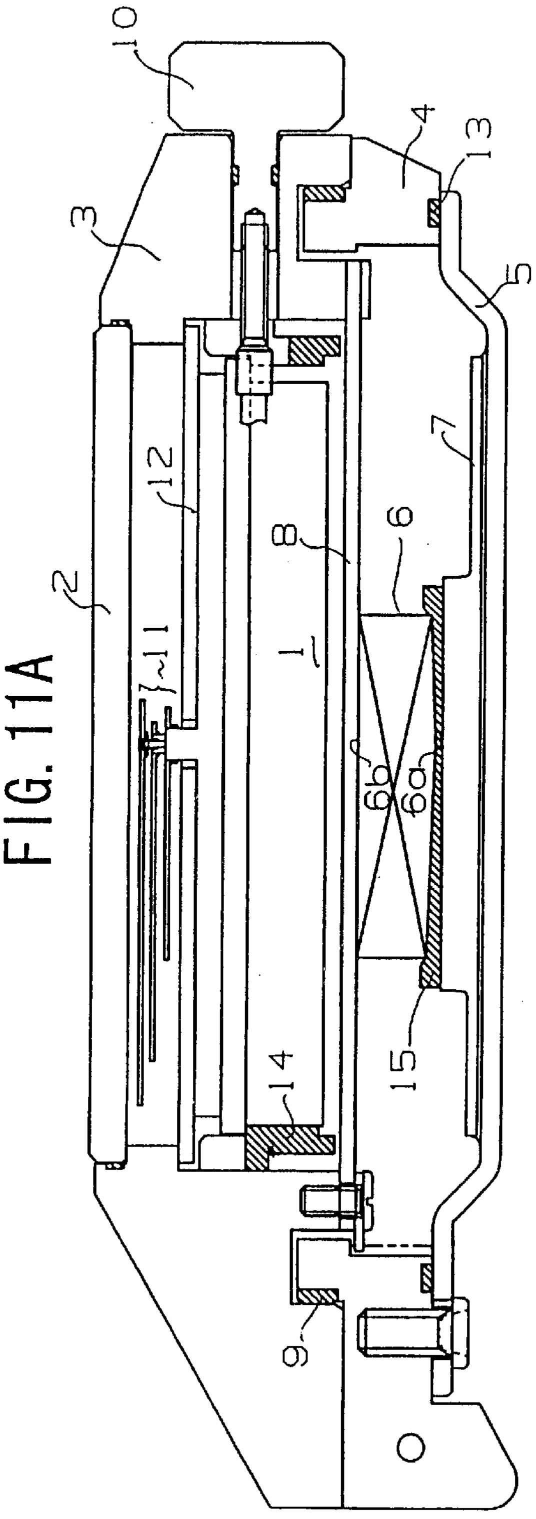
FIGS. 11A–11B are cross sectional views of a wristwatch exemplified as the embodiment 5 of a portable wrist device according to the present invention.
Figure 11B:
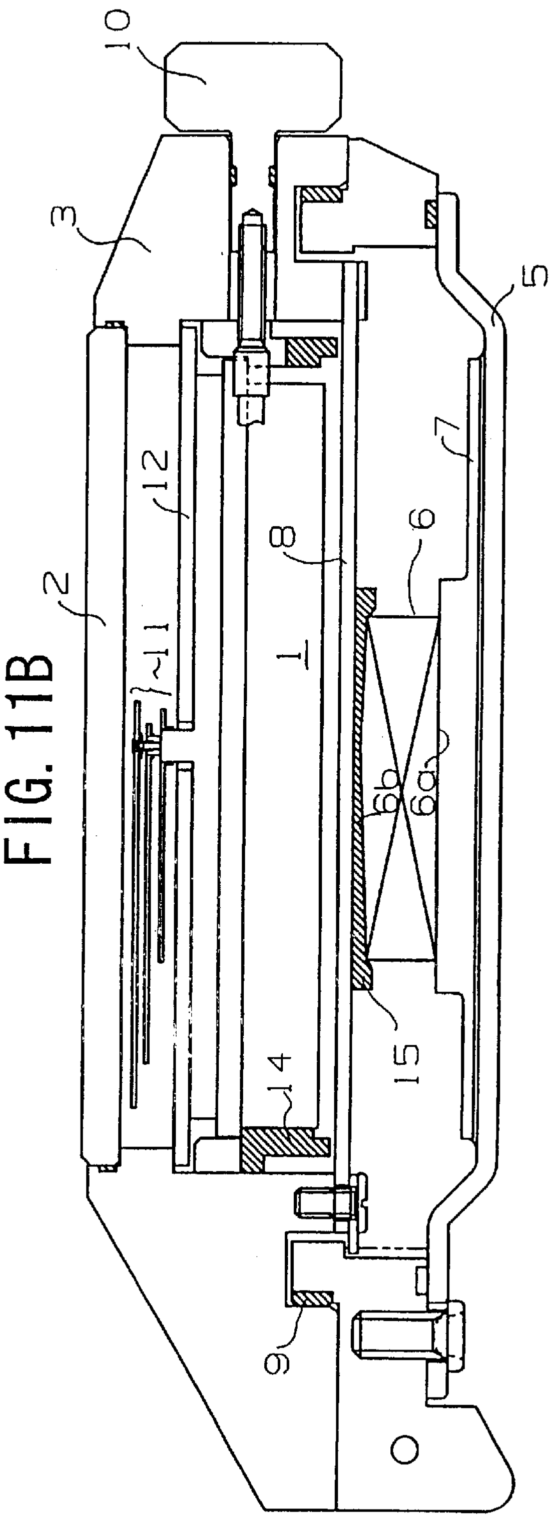

FIGS. 11A and 11B show other application examples. FIG. 11A shows an embodiment with a sloped face of the heat receiving portion 6a on the thermoelectric generator 6. FIG. 11B shows an embodiment with the heat transfer cushion 15 inserted between the thermoelectric generator 6 and the heat conducting plate 8, and with a sloped face of the heat radiating portion 6b on the thermoelectric generator 6.

Figure 12A:
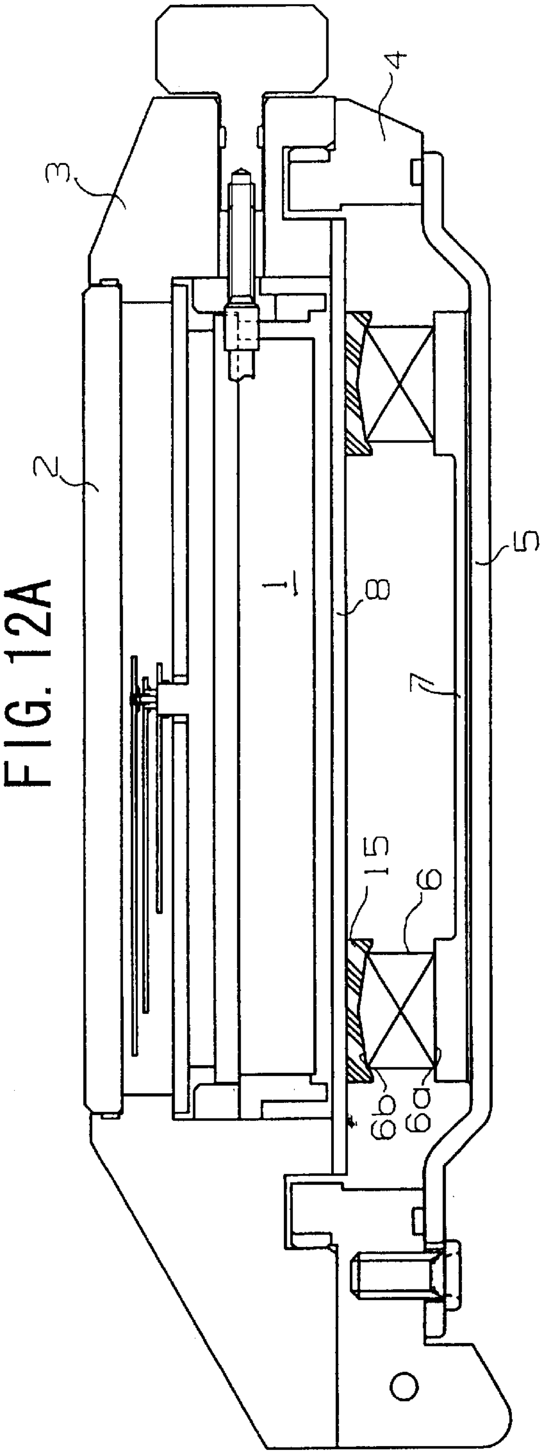
FIGS. 12A–12B are cross sectional views of a wristwatch exemplified as the embodiment 5 of a portable wrist device according to the present invention.
Figure 12B:
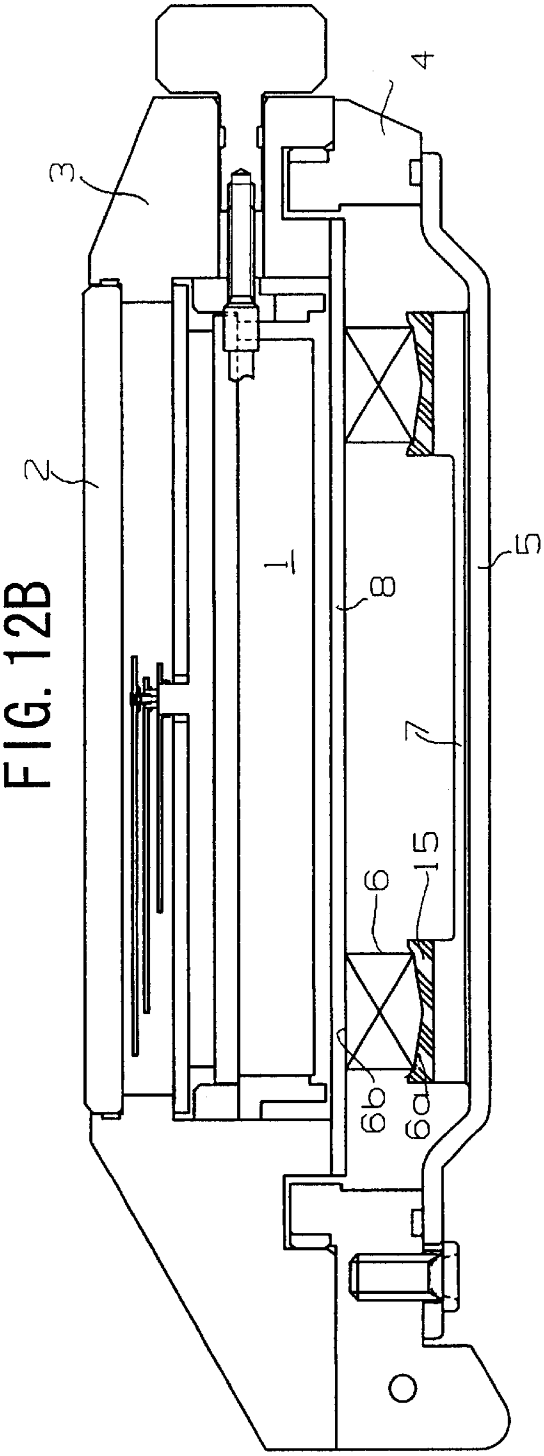

FIG. 12A shows an embodiment in which the heat transfer cushion 15 is inserted between the ring shaped thermoelectric generator 6 and the heat conducting plate 8, and in which the face of the heat radiating portion 6b on the ring shape thermoelectric generator 6 is sloped. FIG. 12B shows an embodiment with a sloped face of the heat receiving portion 6a on the ring shape thermoelectric generator 6.

Figure 13A:
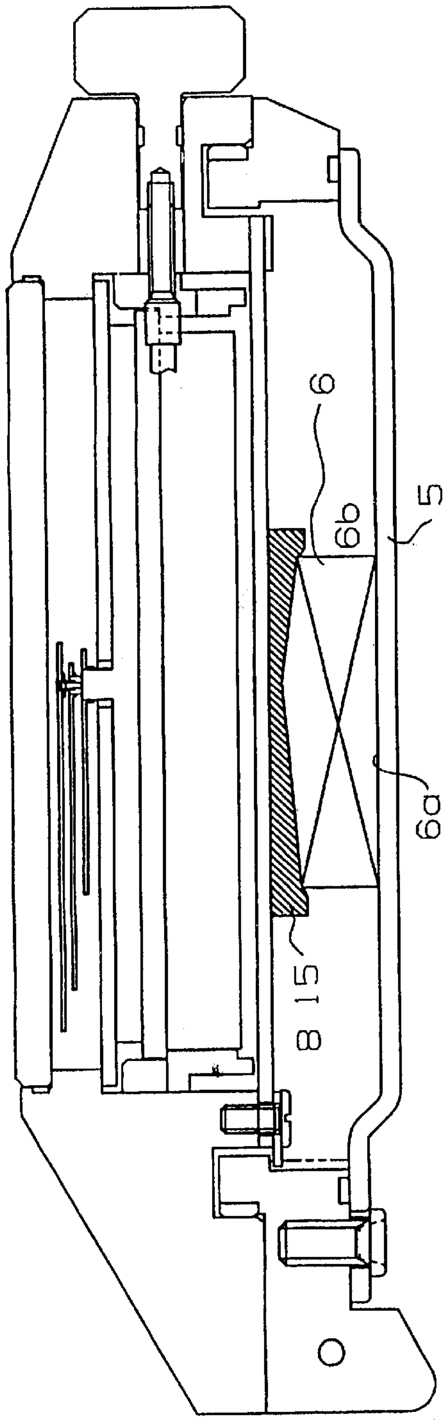
FIGS. 13A–13B are cross sectional views of a wristwatch exemplified as the embodiment 5 of a portable wrist device according to the present invention.
Figure 13B:
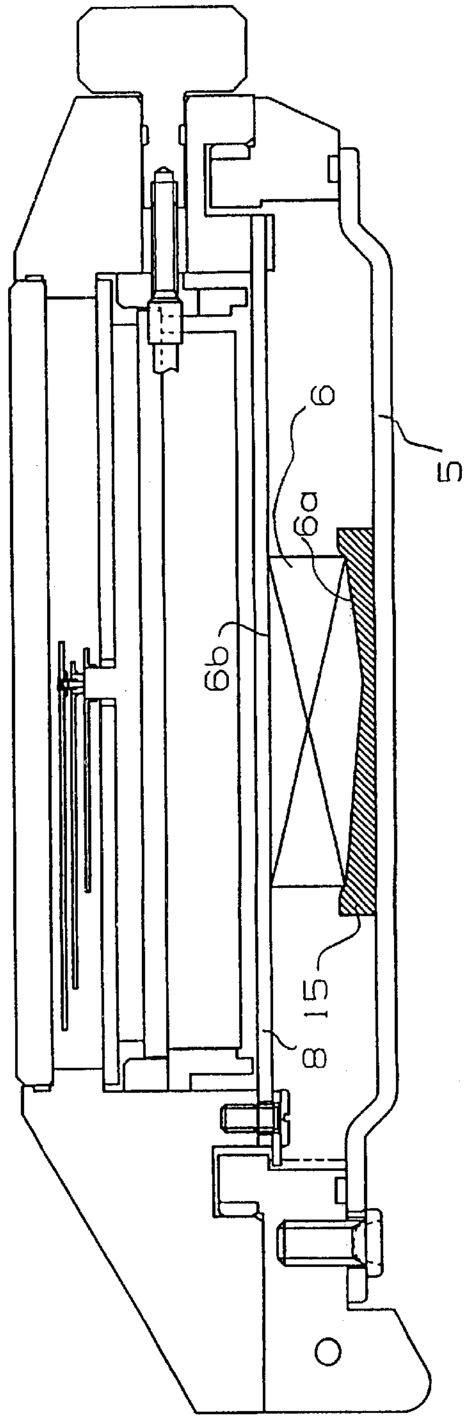

FIG. 13A shows an embodiment with a sloped face of the heat radiating portion 6b on the thermoelectric generator 6, while FIG. 13B shows an embodiment with a sloped face of the heat receiving portion 6a on the thermoelectric generator 6. Both are the same for cases where the thermoelectric generator is of ring shape.

According to the portable wrist device of the present invention for a wristwatch in the state of being worn, since the heat collecting plate is formed on the inside face of the back cover, (the face that is joined to the heat receiving portion on the thermoelectric generator), by a material with higher thermal conductivity than the back cover, heat (body temperature) from the wrist (high temperature section) can be transmitted to the heat collecting plate 7 through the back cover 5. Further, the heat that is transmitted can collect in the thick section 7A of the heat collecting plate and can be transferred to the heat receiving portion 6a on the thermoelectric generator 6.

In addition, for cases in which the entire base surface of the back cover is in close contact with the wrist, by adapting the face shape of the heat collecting plate that closely contacts the back cover to the same shape as that of the back cover base surface (inside face), the most efficient collection of heat from the wrist can be performed. On the other hand, for cases in which the base surface of the back cover is wide and is only in close contact with a portion of the wrist, by adapting the face shape of the heat collecting plate that closely contacts the back cover to the same shape as that of the portion contacting the wrist, the most efficient collection of heat from the wrist can be performed.

In addition, for cases in which the plane projection shape region of the heat receiving portion on the thermoelectric generator protrudes out from the contact area of the back cover 5, a gap is provided so that the protruding portion does not directly and closely contact the base surface of the back cover, and does not contact portions outside the back cover wrist contact area. The heat from the heat collecting plate can then be prevented from moving again from the heat collecting plate to the outer perimeter of the back cover.

Further, by either applying an insulating paint or affixing an insulating sheet to the surface of the heat collecting plate, excepting the contact area with the back cover and contact portion to the heat receiving portion on the thermoelectric generator, wasteful heat radiation can be avoided. In addition, the heat collecting plate can be maintained at a high temperature, and high temperature heat can be supplied to the thermoelectric generator.

Furthermore, by inserting a heat transfer cushion, errors in production can easily be absorbed, and the part size precision can be eased, which can facilitate production and reduce production costs.

In addition, by sloping the contact face, first the center section contacts and then the contact portion expands little by little, so compressive force increases little by little. Also, a component force in the circumferential direction arises, and an action works to push out the excess thickness of the heat transfer cushion in the circumferential direction, so a large amount of displacement can be obtained with a small force.

Further, by making a slope, the center section sinks deeper into the heat transfer cushion, and the heat collecting plate and the heat receiving portion on the thermoelectric generator, both metals with a high thermal conductivity, become closer leading to better thermal conduction. Also, the contact area of the heat transfer cushion becomes larger and the movement of heat increases by making a slope, so drops in power generation capability caused by using the heat transfer cushion are improved.

In this manner, by skillfully adapting the shape and material of the back cover and the heat collecting plate, heat from the human body (high temperature section) can be made difficult to transfer to portions which one does not want to transfer heat (the insulating lower frame), and be intensively transferred to portion which one wants to transfer heat (the heat receiving portion 6*a* on the thermoelectric generator 6). The heat can be effectively distributed and the power generation capabilities can be utilized to the maximum extent.

What is claimed is:

1. A portable wrist device comprising: a thermoelectric generator for generating electric energy from a temperature difference between a heat receiving portion and a heat radiating portion; a heat radiating upper frame for radiating heat from the heat radiating portion of the thermoelectric generator; a back cover for supplying heat to the heat receiving portion of the thermoelectric generator, the back cover having an inner surface connected to the heat receiving portion of the thermoelectric generator and an outer surface for contacting a wrist of a user; and a heat collecting plate disposed on the inner surface of the back cover and formed of a material having a thermal conductivity higher than a thermal conductivity of material of the back cover, the heat collecting plate having a portion disposed in contact with the heat receiving portion of the thermoelectric generator; wherein the portion of the heat collecting plate disposed in contact with the heat receiving portion of the thermoelectric generator is thicker than other portions of the heat collecting plate; and wherein the heat collection plate is smaller in cross-section than one of a contact plane of the entire inner surface of the back cover and a portion of the back cover for contacting the wrist of the user.

2. A portable wrist device as claimed in claim 1; wherein the heat collecting plate has a thermal conductivity greater than four times the thermal conductivity of the back cover.

3. A portable wrist device as claimed in claim 1; wherein when the heat receiving portion of the thermoelectric generator has a portion which protrudes out from a contact area with the back cover, the heat collecting plate provides a gap for preventing the protruding portion from contacting a base surface of the back cover directly.

4. A portable wrist device as claimed in claim 1; wherein when a plane projection between the heat receiving portion of the thermoelectric generator and the heat collecting plate protrudes out from respective contact areas with the back cover, a gap is provided for preventing the protruding portion from contacting a base surface of back cover directly.

5. A portable wrist device as claimed in claim 1; wherein the heat collecting plate is fixedly adhered to the back cover.

6. A portable wrist device as claimed in claim 1; further comprising an insulating paint coating disposed on a surface of the heat collecting plate except for portions thereof in contact with the back cover and the heat receiving portion of the thermoelectric generator.

7. A portable wrist device as claimed in claim 1; further comprising an insulating sheet disposed on a surface of the heat collecting plate except for portions thereof in contact with the back cover and the heat receiving portion of the thermoelectric generator.

8. A portable wrist device as claimed in claim 1; wherein the heat collecting plate is generally ring-shaped.

9. A portable wrist device has claimed in claim 1; further comprising a thermal conductivity material for connecting the heat collecting plate to the inner surface of the back cover.

10. A portable wrist device as claimed in claim 1; further comprising an elastic heat conductor comprised of silicon resin for undergoing elastic deformation, the elastic heat conductor being disposed between the inner surface of the back cover and the heat receiving portion of the thermoelectric generator.

11. A portable wrist device as claimed in claim 10; wherein at least one surface of one: of the back cover and the heat receiving portion of the thermoelectric generator is in contact with the elastic heat conductor.

12. A portable wrist device as claimed in claim 10; wherein the elastic heat conductor is generally ring-shaped.

13. A portable wrist device as claimed in claim 1; further comprising an elastic heat conductor comprised of silicon resin for undergoing elastic deformation, the elastic heat conductor being disposed between the heat radiating upper frame and the heat radiating portion of the thermoelectric generator.

14. A portable wrist device comprising: a thermoelectric generator for generating electric energy from a temperature difference between a heat receiving portion and a heat radiating portion; a heat radiating upper frame for radiating heat from the heat radiating portion of the thermoelectric generator; a back cover for supplying heat to the heat receiving portion of the thermoelectric generator, the back cover having an inner surface connected to the heat receiving portion of the thermoelectric generator and an outer surface for contacting a wrist of a user; and a heat collecting plate disposed on the inner surface of the back cover and having a contact portion disposed in contact with the heat receiving portion of the thermoelectric generator, the contact portion having a thickness greater than other portions of the heat collecting plate for storing higher temperature heat.

15. A portable wrist device as claimed in claim 14; wherein the heat collecting plate is integrally connected to the back cover.

16. A portable wrist device as claimed in claim 14; further comprising an insulating paint coating disposed on portions of the heat collecting plate other than portions thereof in contact with the back cover and the heat receiving portion of the thermoelectric generator.

17. A portable wrist device as claimed in claim 14; further comprising an insulating sheet disposed on portions of the heat collecting plate other than portions thereof in contact with the back cover and the heat receiving portion of the thermoelectric generator.

18. A portable wrist device has claimed in claim 16; further comprising a thermal conductivity material for connecting the heat collecting plate to the inner surface of the back cover.

* * * * *